(12) United States Patent
Portmann

(10) Patent No.: US 10,444,892 B2
(45) Date of Patent: Oct. 15, 2019

(54) CAPACITANCE MEASUREMENT DEVICE WITH REDUCED NOISE

(71) Applicant: Microchip Technology Incorporated, Chandler, AZ (US)

(72) Inventor: Lionel Portmann, Lausanne (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 43 days.

(21) Appl. No.: 15/286,986

(22) Filed: Oct. 6, 2016

(65) Prior Publication Data

US 2017/0102815 A1 Apr. 13, 2017

Related U.S. Application Data

(60) Provisional application No. 62/238,318, filed on Oct. 7, 2015.

(51) Int. Cl.

| | | |
|---|---|---|
| *G06F 3/041* | (2006.01) | |
| *G06F 3/044* | (2006.01) | |
| *H03K 17/955* | (2006.01) | |
| *H03K 17/96* | (2006.01) | |
| *G01L 1/14* | (2006.01) | |
| *G06F 3/0354* | (2013.01) | |

(52) U.S. Cl.
CPC ............ *G06F 3/0416* (2013.01); *G01L 1/146* (2013.01); *G06F 3/03547* (2013.01); *G06F 3/044* (2013.01); *H03K 17/955* (2013.01); *H03K 17/962* (2013.01); *G06F 2203/0339* (2013.01); *H03K 2217/960705* (2013.01); *H03K 2217/960775* (2013.01)

(58) Field of Classification Search
CPC ... G01L 1/146; G06F 3/03547; G06F 3/0416; G06F 3/044; G06F 2203/0339; H03K 17/955; H03K 17/962; H03K 2217/960705; H03K 2217/960775
See application file for complete search history.

(56) References Cited

U.S. PATENT DOCUMENTS

| | | | | |
|---|---|---|---|---|
| 6,297,811 | B1 * | 10/2001 | Kent ...................... | G06F 3/044 178/18.01 |
| 7,460,441 | B2 * | 12/2008 | Bartling ............. | G01R 27/2605 341/166 |
| 7,619,618 | B2 * | 11/2009 | Westerman ........... | G06F 3/0235 345/173 |

(Continued)

OTHER PUBLICATIONS

International Search Report and Written Opinion, Application No. PCT/US2016/055905, 13 pages, dated Jan. 19, 2017.

*Primary Examiner* — Michael J Jansen, II
(74) *Attorney, Agent, or Firm* — Slayden Grubert Beard PLLC

(57) ABSTRACT

A method or sensor arrangement for providing capacitive sensor detection with at least one capacitive sensor comprises a transmitting electrode and a receiving electrode. A stimulus at the transmitting electrode is generated and a signal is received from the receiving electrode and data packets are generated, each packet comprising a plurality of samples. The plurality of samples are weighted by providing less gain at a beginning and end of each packet with respect to a center of each packet; and the weighted samples are integrated to generate an output signal for each packet.

28 Claims, 8 Drawing Sheets

(56) References Cited

U.S. PATENT DOCUMENTS

| | | | | |
|---|---|---|---|---|
| 7,656,394 | B2* | 2/2010 | Westerman | G06F 3/0235 345/173 |
| 7,764,213 | B2* | 7/2010 | Bartling | H03M 1/68 341/152 |
| 8,035,622 | B2* | 10/2011 | Hotelling | G06F 3/0416 341/126 |
| 8,049,732 | B2* | 11/2011 | Hotelling | G06F 3/044 345/173 |
| 8,279,180 | B2* | 10/2012 | Hotelling | G06F 3/044 345/173 |
| 8,542,215 | B2* | 9/2013 | Hanauer | G06F 3/0416 345/174 |
| 8,729,911 | B2* | 5/2014 | Maharyta | G06F 3/044 324/658 |
| 8,754,867 | B2* | 6/2014 | Krah | G06F 3/041 345/173 |
| 8,878,797 | B2* | 11/2014 | Erdogan | G01R 27/2605 178/18.06 |
| 8,890,841 | B2* | 11/2014 | Rebeschi | G06F 3/0418 345/174 |
| 8,933,907 | B2* | 1/2015 | Hanauer | G06F 3/0416 345/173 |
| 9,001,082 | B1* | 4/2015 | Rosenberg | G06F 3/0414 178/18.05 |
| 9,007,341 | B2* | 4/2015 | Lin | G06F 3/044 345/173 |
| 9,013,442 | B2* | 4/2015 | Hotelling | G06F 3/0416 178/18.06 |
| 9,071,264 | B2* | 6/2015 | Lundstrum | H03K 17/9622 |
| 9,081,450 | B1* | 7/2015 | Mohindra | G06F 3/044 |
| 9,098,148 | B2* | 8/2015 | Sharma | G06F 3/0426 |
| 9,098,155 | B2* | 8/2015 | Hanssen | G06F 3/044 |
| 9,128,573 | B2* | 9/2015 | Angelini | G06F 3/0416 |
| 9,141,148 | B2* | 9/2015 | Richter | G06F 1/1626 |
| 9,189,093 | B2* | 11/2015 | Ivanov | G06F 3/044 |
| 9,195,352 | B2* | 11/2015 | Akai | G06F 3/044 |
| 9,201,556 | B2* | 12/2015 | Free | G06F 3/03545 |
| 9,229,593 | B2* | 1/2016 | Layton | G06F 3/0416 |
| 9,250,752 | B2* | 2/2016 | Karpin | G06F 3/0416 |
| 9,256,333 | B2* | 2/2016 | Singh | G06F 3/0418 |
| 9,268,432 | B2* | 2/2016 | Guo | G06F 3/0416 |
| 9,279,874 | B2* | 3/2016 | Heim | G01R 35/005 |
| 9,292,125 | B2* | 3/2016 | Kim | G06F 3/0416 |
| 9,310,952 | B2* | 4/2016 | Hanauer | G06F 3/0416 |
| 9,323,379 | B2* | 4/2016 | Aubauer | G06F 3/0416 |
| 9,372,582 | B2* | 6/2016 | Brunet | G06F 3/044 |
| 9,389,256 | B2* | 7/2016 | Angelini | G06F 3/044 |
| 9,436,326 | B2* | 9/2016 | Jo | G06F 3/0418 |
| 9,535,530 | B2* | 1/2017 | Cho | G06F 3/0416 |
| 9,542,045 | B2* | 1/2017 | Sharma | G06F 3/0426 |
| 9,542,051 | B2* | 1/2017 | Davison | H03K 17/962 |
| 9,557,721 | B2* | 1/2017 | Nakajima | G05B 11/01 |
| 9,568,526 | B2* | 2/2017 | Voris | G01R 27/2605 |
| 9,590,649 | B2* | 3/2017 | Bartling | H03K 17/9622 |
| 9,625,507 | B2* | 4/2017 | Erdogan | G01R 27/2605 |
| 9,665,204 | B2* | 5/2017 | Heim | G06F 3/0416 |
| 9,671,920 | B2* | 6/2017 | Portmann | G06F 3/044 |
| 9,678,192 | B2* | 6/2017 | Heim | G01R 35/005 |
| 9,727,118 | B2* | 8/2017 | Nys | G06F 1/324 |
| 9,791,487 | B2* | 10/2017 | Chang | G01R 27/2605 |
| 9,857,828 | B2* | 1/2018 | Aubauer | G06F 1/16 |
| 9,921,690 | B2* | 3/2018 | Aubauer | G06F 3/044 |
| 9,927,933 | B2* | 3/2018 | Heim | G06F 3/017 |
| 9,946,397 | B2* | 4/2018 | Dorfner | G06F 3/0416 |
| 10,108,292 | B2* | 10/2018 | Dorfner | G06F 3/0416 |
| 10,135,424 | B2* | 11/2018 | Heim | G06F 17/18 |
| 10,151,608 | B2* | 12/2018 | Fontes | G01D 5/24 |
| 10,277,203 | B2* | 4/2019 | Heim | H03H 17/06 |
| 10,303,285 | B2* | 5/2019 | Dorfner | G06F 3/017 |
| 10,345,985 | B2* | 7/2019 | Portmann | G06F 3/044 |
| 10,352,976 | B2* | 7/2019 | Aubauer | G01R 27/2605 |
| 2007/0257890 | A1* | 11/2007 | Hotelling | G06F 3/044 345/173 |
| 2007/0291012 | A1* | 12/2007 | Chang | G06F 3/044 345/173 |
| 2008/0106520 | A1* | 5/2008 | Free | G06F 3/03545 345/173 |
| 2008/0165116 | A1* | 7/2008 | Herz | G09G 3/3406 345/102 |
| 2009/0244014 | A1* | 10/2009 | Hotelling | G06F 3/0416 345/173 |
| 2011/0157438 | A1* | 6/2011 | Compton | H04N 5/341 348/294 |
| 2011/0169768 | A1* | 7/2011 | Matsushima | G06F 3/0418 345/174 |
| 2011/0227865 | A1* | 9/2011 | Baek | G06F 3/0418 345/174 |
| 2011/0234508 | A1* | 9/2011 | Oda | G06F 3/044 345/173 |
| 2011/0267309 | A1* | 11/2011 | Hanauer | G06F 3/0416 345/174 |
| 2011/0273402 | A1* | 11/2011 | Hotelling | G06F 3/0416 345/174 |
| 2011/0291928 | A1* | 12/2011 | Chou | G06F 3/0395 345/158 |
| 2012/0044199 | A1* | 2/2012 | Karpin | G06F 3/0416 345/174 |
| 2012/0062498 | A1* | 3/2012 | Weaver | G06F 3/03545 345/174 |
| 2012/0113047 | A1* | 5/2012 | Hanauer | G06F 3/0416 345/174 |
| 2012/0268145 | A1* | 10/2012 | Chandra | G06F 3/044 324/686 |
| 2012/0287081 | A1* | 11/2012 | Akai | G06F 3/044 345/174 |
| 2012/0313882 | A1* | 12/2012 | Aubauer | G06F 3/046 345/174 |
| 2012/0313890 | A1* | 12/2012 | Mohindra | G06F 3/0416 345/174 |
| 2012/0326734 | A1* | 12/2012 | Cho | G06F 3/0416 324/684 |
| 2013/0088242 | A1* | 4/2013 | Lundstrum | H03K 17/9622 324/609 |
| 2013/0120309 | A1* | 5/2013 | Mo | G06F 3/044 345/174 |
| 2013/0147833 | A1* | 6/2013 | Aubauer | G06F 3/0416 345/619 |
| 2013/0176236 | A1* | 7/2013 | Ivanov | G06F 3/044 345/173 |
| 2013/0241887 | A1* | 9/2013 | Sharma | G06F 3/0426 345/175 |
| 2013/0241889 | A1* | 9/2013 | Sharma | G06F 3/0426 345/175 |
| 2013/0241890 | A1* | 9/2013 | Sharma | G06F 3/0426 345/175 |
| 2013/0257458 | A1* | 10/2013 | Chang | G01R 27/2605 324/683 |
| 2013/0257803 | A1* | 10/2013 | Layton | G06F 3/0416 345/174 |
| 2013/0271410 | A1* | 10/2013 | Krah | G06F 3/041 345/173 |
| 2013/0278538 | A1* | 10/2013 | Brunet | G06F 3/044 345/174 |
| 2013/0294200 | A1* | 11/2013 | Dahl | G06F 3/0416 367/135 |
| 2014/0046460 | A1* | 2/2014 | Nakajima | G05B 11/01 700/56 |
| 2014/0049266 | A1* | 2/2014 | Heim | G01R 35/005 324/603 |
| 2014/0074436 | A1* | 3/2014 | Voris | G01R 27/2605 702/194 |
| 2014/0077823 | A1* | 3/2014 | Angelini | G06F 3/044 324/658 |
| 2014/0104223 | A1* | 4/2014 | Hanssen | G06F 3/044 345/174 |
| 2014/0111443 | A1* | 4/2014 | Guo | G06F 3/0416 345/173 |
| 2014/0146002 | A1* | 5/2014 | Mo | G06F 3/044 345/174 |

(56) References Cited

U.S. PATENT DOCUMENTS

| | | | | |
|---|---|---|---|---|
| 2014/0152328 A1* | 6/2014 | Erdogan | G01R 27/2605 | 324/679 |
| 2014/0240256 A1* | 8/2014 | Kim | G06F 3/0416 | 345/173 |
| 2014/0267129 A1* | 9/2014 | Rebeschi | G06F 3/0418 | 345/174 |
| 2014/0267155 A1* | 9/2014 | Aubauer | G01R 27/2605 | 345/174 |
| 2014/0375595 A1* | 12/2014 | Lin | G06F 3/044 | 345/174 |
| 2015/0091820 A1* | 4/2015 | Rosenberg | G06F 3/0414 | 345/173 |
| 2015/0097809 A1* | 4/2015 | Heim | G06F 3/0416 | 345/174 |
| 2015/0103047 A1* | 4/2015 | Hanauer | G06F 3/0416 | 345/174 |
| 2015/0145801 A1* | 5/2015 | Angelini | G06F 3/044 | 345/174 |
| 2015/0193042 A1* | 7/2015 | Jo | G06F 3/044 | 345/174 |
| 2015/0293621 A1* | 10/2015 | Singh | G06F 3/044 | 345/173 |
| 2015/0301735 A1* | 10/2015 | Hoch | G06F 3/044 | 345/174 |
| 2015/0302831 A1* | 10/2015 | Reynolds | G06F 3/0418 | 345/174 |
| 2015/0338952 A1* | 11/2015 | Shahparnia | G06F 3/044 | 345/174 |
| 2015/0378482 A1* | 12/2015 | Portmann | G06F 3/044 | 345/174 |
| 2016/0011692 A1* | 1/2016 | Heim | G06F 3/017 | 345/174 |
| 2016/0018867 A1* | 1/2016 | Nys | G01R 27/2605 | 324/674 |
| 2016/0054754 A1* | 2/2016 | Aubauer | G06F 1/16 | 345/174 |
| 2016/0054850 A1* | 2/2016 | Aubauer | G06F 1/16 | 345/174 |
| 2016/0112060 A1* | 4/2016 | Bartling | H03K 17/9622 | 341/155 |
| 2016/0117014 A1* | 4/2016 | Davison | H03K 17/962 | 345/174 |
| 2016/0124568 A1* | 5/2016 | Heim | G06F 3/04883 | 345/174 |
| 2016/0187450 A1* | 6/2016 | Heim | G01R 35/005 | 324/603 |
| 2016/0261250 A1* | 9/2016 | Heim | H03H 17/06 | |
| 2016/0313851 A1* | 10/2016 | Dorfner | G06F 3/0416 | |
| 2016/0313852 A1* | 10/2016 | Dorfner | G06F 3/017 | |
| 2016/0364074 A1* | 12/2016 | Dorfner | G06F 3/0416 | |
| 2017/0040977 A1* | 2/2017 | Heim | H03H 17/06 | |
| 2017/0090609 A1* | 3/2017 | Petrovic | G06F 3/044 | |
| 2017/0102815 A1* | 4/2017 | Portmann | G01L 1/146 | |
| 2017/0176225 A1* | 6/2017 | Fontes | G01D 5/24 | |
| 2017/0235475 A1* | 8/2017 | Heim | G06F 3/04847 | 345/174 |
| 2017/0269741 A1* | 9/2017 | Portmann | G06F 3/044 | |
| 2017/0293362 A1* | 10/2017 | Heim | G06F 3/017 | |
| 2018/0004944 A1* | 1/2018 | Nagata | G06F 11/22 | |

* cited by examiner

CAPACITANCE MEASUREMENT DEVICE WITH REDUCED NOISE

RELATED PATENT APPLICATION

This application claims priority to commonly owned U.S. Provisional Patent Application No. 62/238,318; filed Oct. 7, 2015; which is hereby incorporated by reference herein for all purposes.

TECHNICAL FIELD

The present disclosure relates to methods and systems for capacitance measurement, in particular capacitance measurement with reduced noise.

BACKGROUND

Projected capacitive sensors are often incorporated in touch screens, touch pads or buttons. Similar sensors are used in non-touching three-dimensional position detection sensor arrangements. These sensors use receiving electrodes and in some embodiments also emitting electrodes. When using two electrodes, one electrode acts as a transmitter and the other electrode as a receiver. A matrix can be formed to allow for a plurality of keys to share transmitting and receiving lines. In practice, the measurement system connected to the receiving electrodes is then often used in a time multiplexing manner. To keep a good responsiveness to user inputs, projected capacitive devices must scan quickly several locations of a mesh of electrodes.

For example, the standardized test "IEC61000-4-6 Immunity to Conducted Disturbances" reveals a common problem of projected capacitive sensors: to acquire a weak signal from the receive electrode at a given frequency when a disturbing noise overlaps the signal with a slightly different frequency. Furthermore, the requirement for short scan time exacerbates this problem of distinguishing signal and noise occupying nearby frequencies.

SUMMARY

According to an embodiment, a method for providing capacitive sensor detection with at least one capacitive sensor comprising a transmitting electrode and a receiving electrode may comprise the steps of: generating a stimulus at the transmitting electrode, receiving a signal from the receiving electrode and generating data packets, each packet comprising a plurality of samples; weighting the plurality of samples by providing less gain at a beginning and end of each packet with respect to a center of each packet; and integrating the weighted samples to generate an output signal for each packet.

According to a further embodiment, a stimulus may comprise a sequence of pulses. According to a further embodiment, each pulse may alternate between ground and a supply voltage. According to a further embodiment, a gain distribution can be symmetrical with respect to the center of each packet and a gain distribution curve is selected from a group of gain curves consisting of a Gaussian curve, a Hamming window, a Hanning window, and a Blackman window. According to a further embodiment, weighting can be performed by applying gain to the analog signals received from the columns or rows. According to a further embodiment, weighting can be performed by applying gain to the digital signals during post processing of each packet. According to a further embodiment, the capacitive sensor can be a touch sensor. According to a further embodiment, a plurality of touch sensors can be arranged in a matrix comprising columns and rows and packets of samples are sampled in parallel from each column or row. According to a further embodiment, a plurality of touch sensors can be arranged in a matrix comprising columns and rows and packets of samples of different columns/rows are sampled sequentially using multiplexing. According to a further embodiment, a plurality of touch sensors can be formed by horizontal and vertical electrodes arranged in a matrix. According to a further embodiment, a plurality of touch sensors can be arranged in a matrix and wherein horizontal and vertical electrodes of the matrix are arranged in different layers. According to a further embodiment, four receiving electrodes can be associated with the transmitting electrode and form a three-dimensional position detection sensor. According to a further embodiment, the four receiving electrodes can be arranged in a frame-like fashion. According to a further embodiment, the four receiving electrodes may surround a display or a touchpad sensor.

According to another embodiment, a sensor arrangement with at least one capacitive sensor may comprise a transmitting electrode configured to receive a stimulus, a receiving electrode capacitively coupled with the transmitting electrode and configured to receive a signal from the transmitting electrode, and an evaluation circuit coupled with the receiving electrode and configured to generate data packets, each packet comprising a plurality of samples, wherein the plurality of samples are weighted by providing less gain at a beginning and end of each packet with respect to a center of each packet, and wherein the evaluating circuit is further configured to integrate the weighted samples to generate an output signal for each packet.

According to a further embodiment of the sensor arrangement, a packet of the stimulus may comprise a sequence of pulses. According to a further embodiment of the sensor arrangement, each pulse may alternate between ground and a supply voltage. According to a further embodiment of the sensor arrangement, a gain distribution can be symmetrical with respect to the center of each packet and a gain distribution curve is selected from a group of gain curves consisting of a Gaussian curve, a Hamming window, a Hanning window, and a Blackman window. According to a further embodiment of the sensor arrangement, gain can be applied to the analog signals received from the receiving electrode. According to a further embodiment of the sensor arrangement, gain can be applied to the digital signals during post processing of each packet. According to a further embodiment of the sensor arrangement, a plurality of touch sensors can be arranged in a matrix comprising columns and rows and packets of samples are sampled in parallel from each column or row. According to a further embodiment of the sensor arrangement, the capacitive sensor can be a touch sensor. According to a further embodiment of the sensor arrangement, a plurality of touch sensors can be arranged in a matrix comprising columns and rows and packets of samples of different columns/rows are sampled sequentially using multiplexing. According to a further embodiment of the sensor arrangement, a plurality of touch sensors can be formed by horizontal and vertical electrodes arranged in a matrix. According to a further embodiment of the sensor arrangement, the sensor arrangement may comprise a plurality of touch sensors are arranged in a matrix and wherein horizontal and vertical electrodes of the matrix are arranged in different layers. According to a further embodiment of the sensor arrangement, four receiving electrodes can be associated with the transmitting electrode and form a three-dimensional position detection sensor. According to a further embodiment of the sensor arrangement, the four receiving electrodes can be arranged in a frame-like fashion. According to a further embodiment of the sensor arrangement, the four receiving electrodes may surround a display or a touchpad sensor.

DETAILED DESCRIPTION

According to various embodiments, a proposed solution is to acquire, for a given selection of active receiving or active emitting electrodes, multiple measurement samples and to integrate these samples with varying gain. One sample is for example a voltage sample converted by an A/D circuit, but the concept is not limited to digital, it also applies to analogue discrete time circuit like switched capacitor circuit and charge integration circuits. These multiple samples form a packet; and packets are delimited by change of the selection of active electrodes.

According to various embodiments, for example, the following method is proposed: following a change of active electrodes, the system gradually increases the importance of measured samples until the middle of the packet and then gradually reduces their importance before the next change of electrodes. Therefore, samples collected after or before a change contribute less to the total result.

When working with an A/D converter, a solution can be implemented with a weighted average of the collected samples, where weight values come from a look up table. It is surprising and remarkable that frequency separation of noise and signal can be achieved after the measurement is done, as a pure mathematical post processing operation. The same operation could be carried in analogue domain by varying, for each sample, the reference level of the A/D converter: more generally, an amplifier with a variable gain located before the signal integration also can be used to allow for a proper implementation.

In the field or projected capacitance sensing, noise and lack of sensitivity is a prevalent concern. A common measure is to average the result over more ADC samples. Since acquiring more ADC samples cost power and time, the intuition is to use the full contribution of each sample, with the hope of getting more total signal. However, against intuition, the various embodiments propose to strongly reduce (but not entirely cancel) the contribution of head and tail samples.

Figure 1:
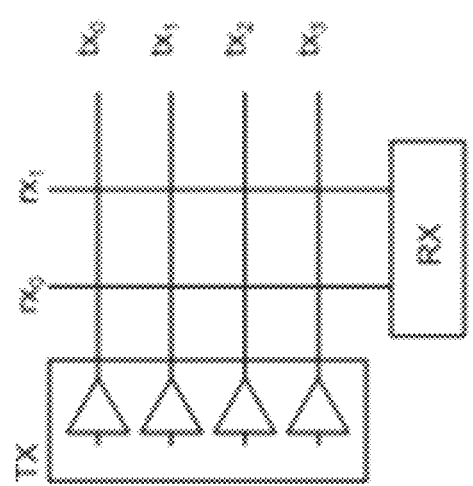
FIG. 1 shows an electrode matrix of a touch sensor arrangement.

FIG. 1 shows a typical exemplary projected capacitive device with one or more receiver electrodes (rxi), and one or more optional stimuli nodes (txj). Typically, the transmitting lines $tx_n$ and the receiving lines $rx_n$ are arranged in a matrix such that the nodes where a transmission line crosses a receiving line form a capacitor that serves as the actual sensor. The matrix reduces the number of lines that would be otherwise needed. The example shown in FIG. 1 uses two receiving lines and four transmitting lines. However, any other number of lines may be used depending on the design. A measurement or evaluation circuit RX in the exemplary embodiment of FIG. 1 are connected to two receiver electrodes $rx_0$ and $rx_1$, and stimulus circuit TX, such as, for example, I/O ports of a microcontroller, are connected to four emitting electrodes $tx_0$, $tx_1$, $tx_2$, and $tx_3$ in this example.

Figure 2:
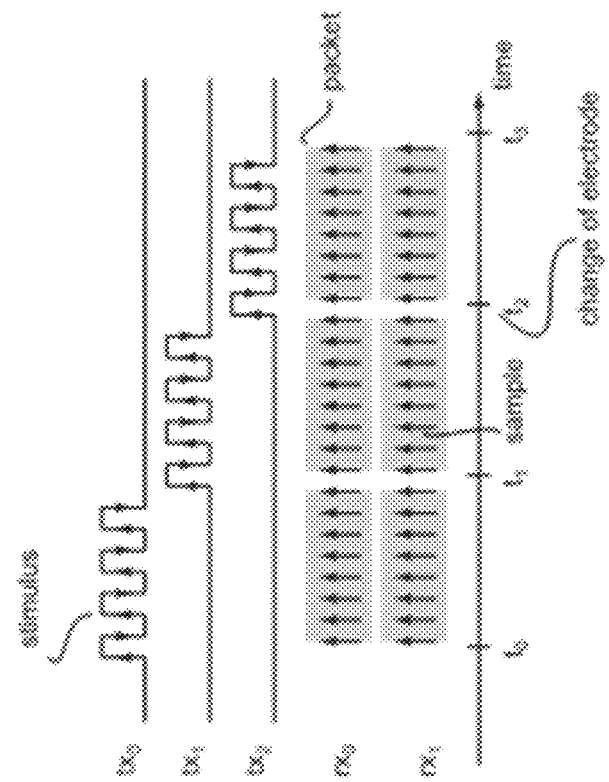
FIG. 2 shows a timing diagram of stimulus and received signals according to a first embodiment.

FIG. 2 shows as an example bursts of stimuli pulses applied in a scan sequence to, for example, three emitting electrodes $tx_0$, $tx_1$, $tx_2$ and corresponding changes at times $t_0$, $t_1$, $t_2$ ... of active emitting electrode $tx_0$, $tx_1$, $tx_2$ which delimit packets of samples. Note, that samples do not necessarily synchronize with stimuli pulses. The fourth transmission line is here not used for a better overview only. In FIG. 2, one assumes each receiving electrode (rx0, rx1) has its own measurement circuit so measurements can be made in parallel.

Figure 3:
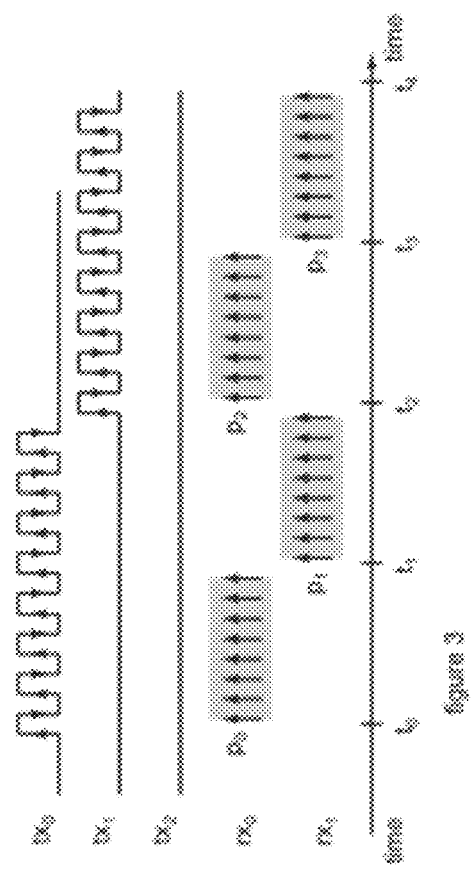
FIG. 3 shows a timing diagram of stimulus and received signals according to a second embodiment.

However, a single measurement circuit with multiplexer circuitry may also be possible but would require a repeated stimulus for each line. FIG. 3 shows such an alternative to FIG. 2. The measure circuit is here multiplexed to different receiving electrodes, and packets of samples $p_0$, $p_1$, $p_2$ are delimited by changes of active receiving electrode $rx_0$, $rx_1$ as well as active emitting electrodes $tx_0$, $tx_1$.

Figure 4:
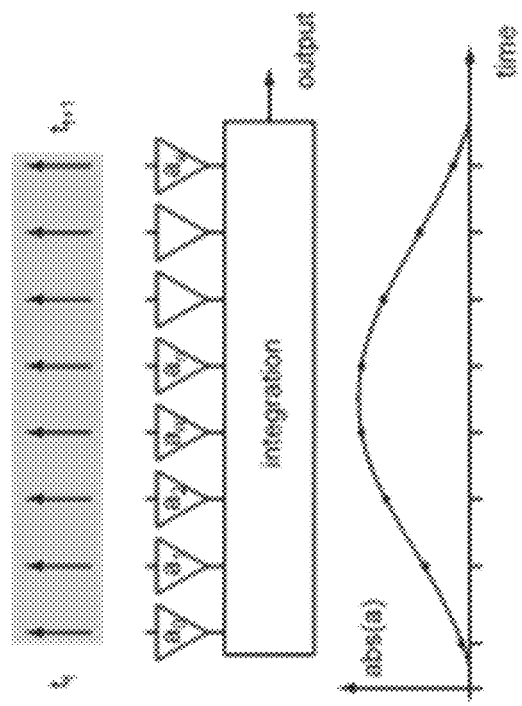
FIG. 4 shows a first embodiment of a weighting function applied to the received signals.

FIG. 4 shows a packet of samples acquired between a start and a stop time $t_i$ and $t_{i+1}$, respectively. Here, each sample is weighted by a gain a $(a_0, a_1 \ldots m, a_e)$. The resulting output is shown as the weighted sum. It is shown how weight applied to samples near the transitions $t_i$ and $t_{i+1}$ get less importance in absolute value $(a_0, a_e)$ compared to samples in the middle of the packet $(a_m, a_n)$. According to some embodiments, a Gaussian weight curve may be applied. Other distribution weight curves may apply, such as Hamming, Hanning, Blackman etc., as long as the first and last measurements receive less gain than a center value.

Figure 5:
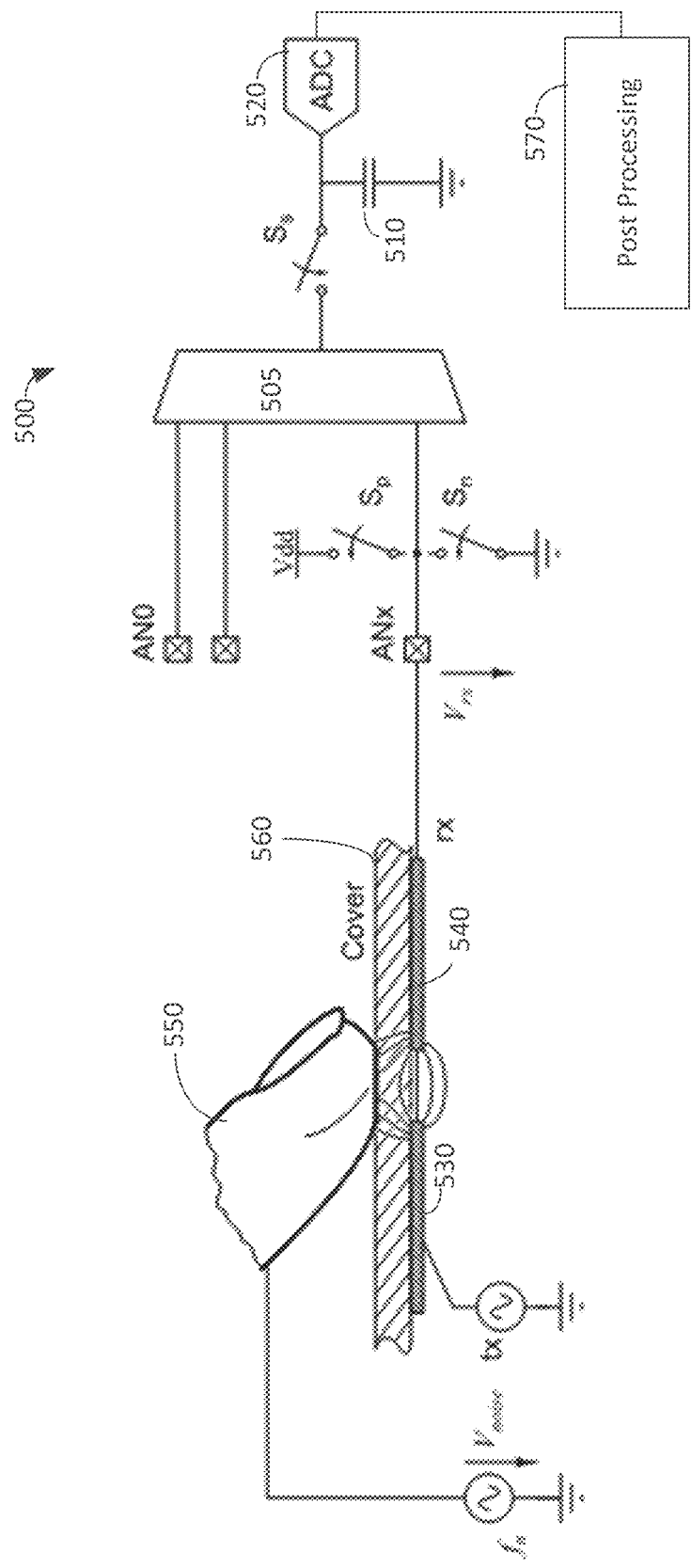
FIG. 5 shows an exemplary circuit arrangement of a touch sensor according to an embodiment.

FIG. 5 shows an example of projected capacitive system with a single capacitive sensor 530, 540, for example, when touched by a finger 550 during the acquisition of one packet. In non-touching embodiments, entering the detection space will influence the signals received at one or more electrodes. According to some embodiments, sensor electrodes 530, 540 may be part of a matrix of electrodes. The capacitive sensor 530, 540 is coupled with an evaluation circuit comprising, for example, a multiplexer 505, sample and hold circuit $S_s$, 510, an analog-to-digital converter 520 and a processing unit 570. In case of a single sensor, multiplexer 505 is of course not needed unless the ADC 520 is used to sample other analog signals. The transmitting electrode 530 or a selected transmitting electrode from a matrix is connected to a source generating a stimulus tx and the receive electrode 540 or one of the receiving electrodes from a matrix is selected from which a signal rx is fed, for example, by an analog multiplexer 505 to a sample and hold circuit with switch $S_s$ and sample capacitor 510. The stimulus can be a series of pulses, wherein, for example, each pulse varies between ground and a supply voltage. A duty cycle of 50% may be used for a sequence of pulses. However, other duty cycles may apply. According to one embodiment, the pulses may be synchronized with the charging/discharging switches Sp, Sn as will be explained in more detail below.

The sampled signal is then converted by an analog-to-digital converter 520 into a digital value which is fed to a processing unit 570 for further processing. In this embodiment, a finger 550 touches the cover material 560 above the electrodes 530, 540 and behaves also as a source of noise (Vnoise) which will influence the received voltage (Vrx). However, other arrangement, for example with exposed electrodes are possible. Applications using the same principles for three-dimensional position detection will be discussed below. According to some embodiments, the receiving electrode 540 can also be momentarily connected to Vdd or to Gnd by switches Sn, Sp to generate a pair of sample values as will be explained below in more detail.

Figure 6:
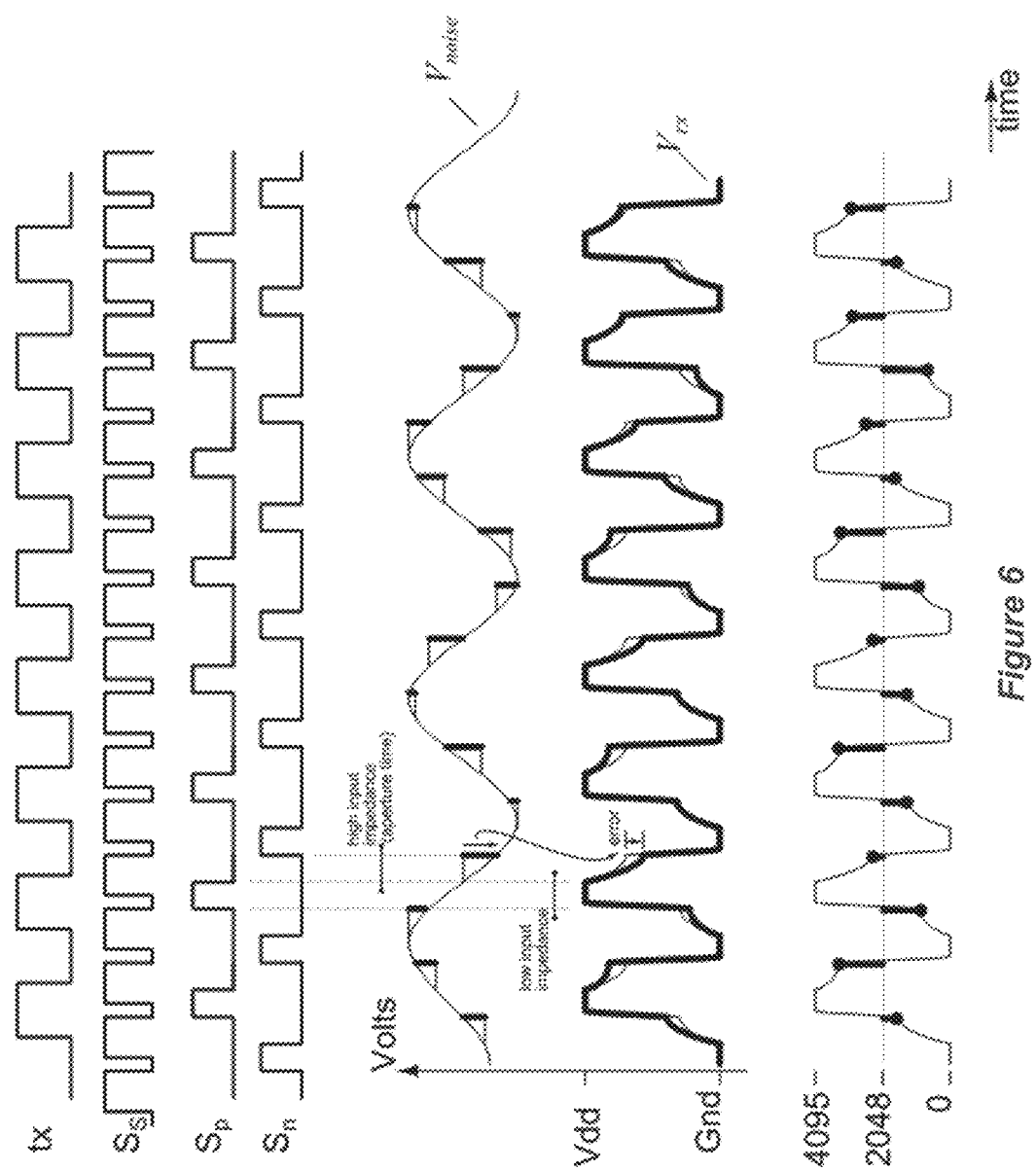
FIG. 6 shows a timing diagram of various signals according to FIG. 5.

FIG. 6 shows a timing diagram of various signals of one embodiment which may for example use the arrangement shown in FIG. 5. FIG. 6 shows one embodiment of a switching sequence and acquisition process. In each sampling cycle, first, the receiving electrode 540 is momentarily connected to ground by switch Sn and signal Sn being high, while the sample and hold is tracking when signal Ss is high. When Sn is disconnected after signal Sn returns to low, a positive stimulus tx is applied on the emitting electrode 530, causing Vrx to rise. In addition to the voltage change caused by the stimulus tx, Vrx also changes—so long Sp or Sn switches are off—due to variation of the potential of the finger with respect to the ground. The sample and hold blocks the signal when signal Ss goes low, and a first or odd sample is acquired and converted. Then, while tx is still high and after the falling edge of Ss, switch Sp is closed for a short period by a positive pulse of signal Sp. Signal Ss then returns high, placing track and hold circuit again in tracking mode. Shortly thereafter, the stimulus tx returns to ground and thereafter, with the falling edge of Ss, a second or even sample is acquired. In this example values comprised between 0 and 4095. An arbitrary pivot value at 2048 is used to refer the amplitude of the samples. FIG. 6 shows that the signal acquired is alternately switched between ground and Vdd and altered from these starting points by the stimulus rx and the noise Vnoise. Thus, by charging the receiving electrode 540 alternately to ground or Vdd, an odd and an even sample is acquired. Depending on whether the noise signal is rising or falling between the falling edge of either Sn or Sp and falling edge of Ss, its contribution is either added or subtracted from the voltage signal Vrx as shown in FIG. 6.

Figure 7:
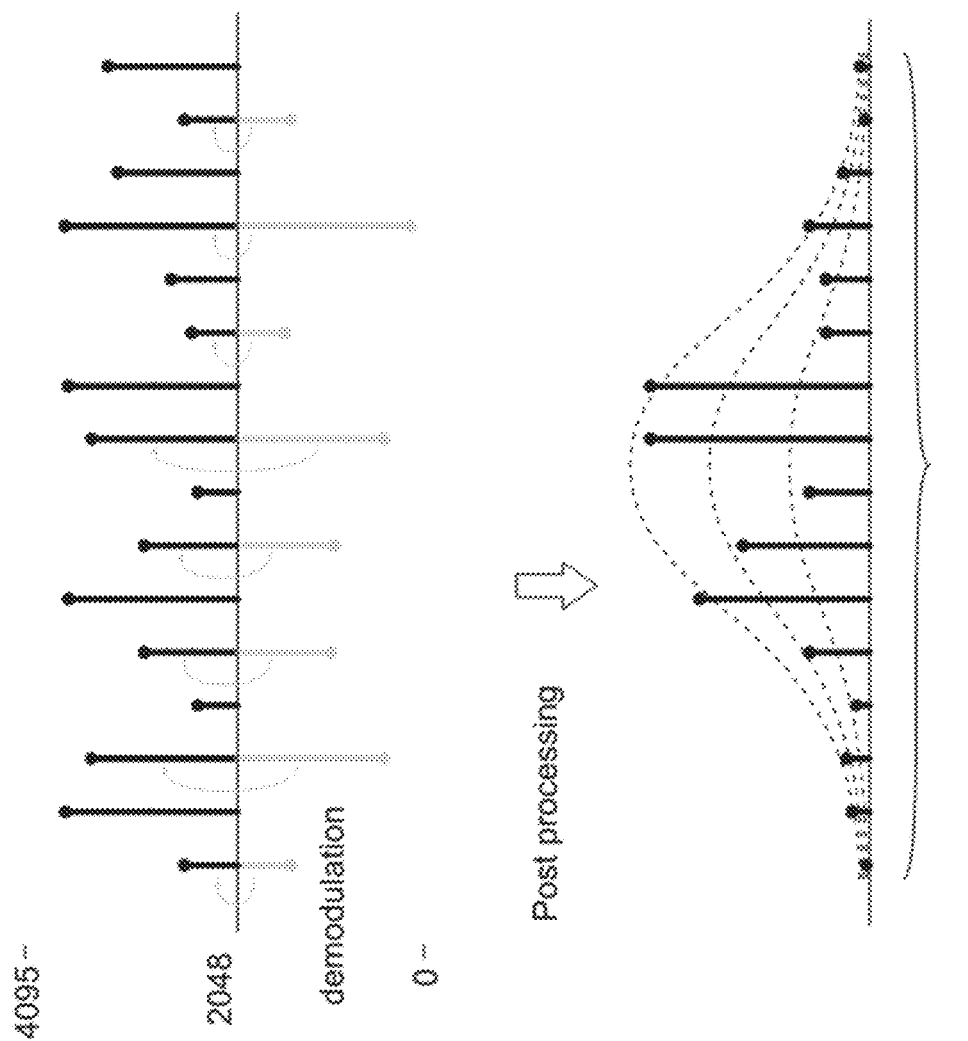
FIG. 7 shows demodulation and weighting according to an embodiment.

FIG. 7 shows the signals acquired according to the timing diagram of FIG. 6 after demodulation. The measurement samples are demodulated in this example by replacing the odd samples by new values equal to 2048-value, and the even samples by new values equal to +value-2048. This demodulation operation corrects the fact that the stimulus tx applied on transmitting electrode 530 alternates positive and negative edges. Finally, this figure illustrates how the samples near the beginning and end of the packet are mathematically multiplied by a smaller weight compared to samples in the middle of the packet as shown with the result after weighting in the bottom curve of FIG. 7.

The demodulation process is specific to the way of applying the stimulus tx. Other sampling schemes may apply. However, it shows that despite a change of the sign of some samples, their importance, or weight, still follows a gradually increasing and then decreasing importance.

Figure 8:
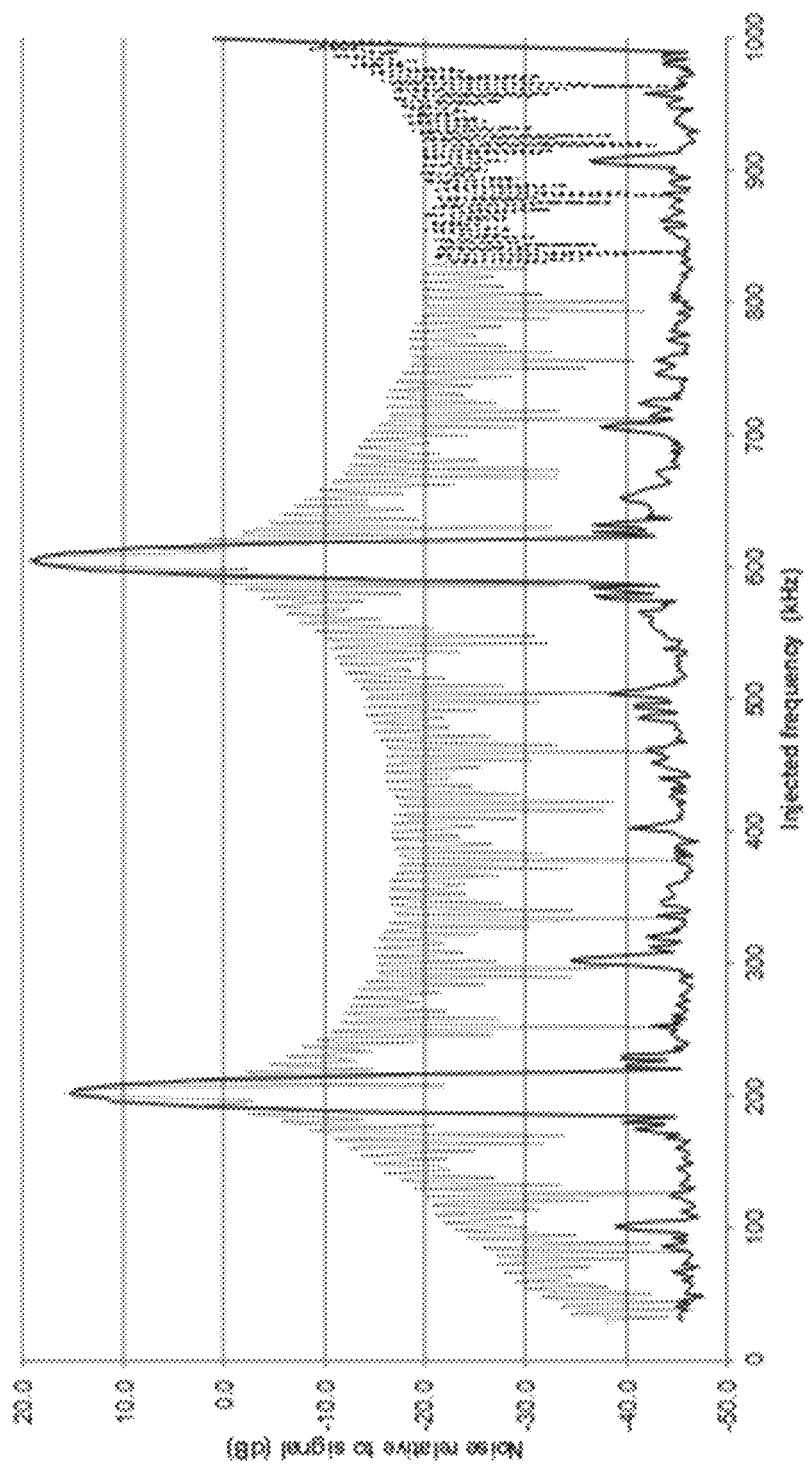
FIG. 8 shows spectral analysis with and without using weighting according to various embodiments.

FIG. 8 shows an experimental comparison of noise level recorded without using the principles of the various embodiments (dashed stroke), and using the principles of the various embodiments (solid stroke). As can be seen the noise floor is significantly improved.

Figure 9:
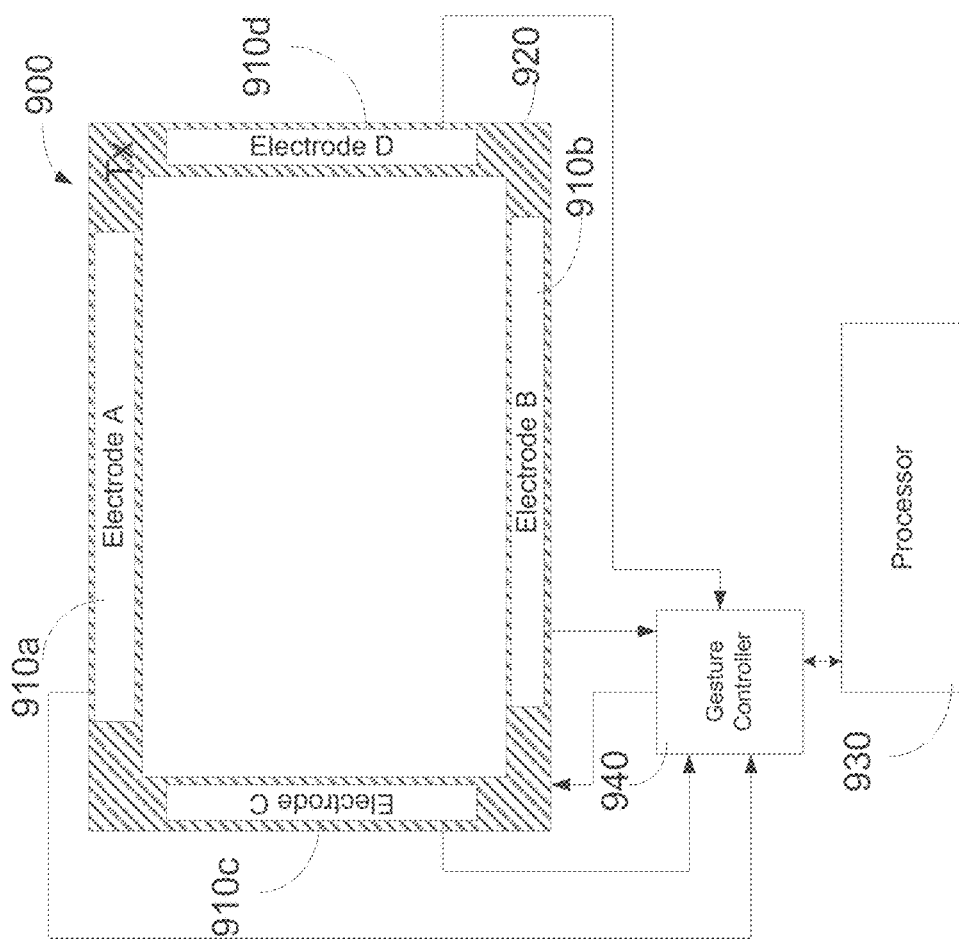
FIG. 9 shows an embodiment of a touchless sensor arrangement.

As discussed with respect to FIG. 1 and FIG. 5, the principles of the various embodiments can be applied to various capacitance measurement methods such as self and mutual capacitance measurements as used in many touch sensor application. FIG. 9 shows an example of a measurement sensor arrangement that can be used in a non-touching sensor application. Here a substrate 900 may comprise a transmitting electrode 920 and a plurality, here four, receiving electrodes 910a, b, c, d. While FIG. 9 shows a frame-like support structure 900 that can be for example arranged around a display, keyboard, or trackpad, other shapes and forms for the substrate may apply. The transmitting electrode 920 may cover the entire backside of the substrate 900 and the receiving electrodes 910a, b, c, d may be arranged on the top side. Such an arrangement can be provided by a double sided printed circuit board wherein the electrodes are formed by the copper layers. However, a single-sided printed circuit board may also be used, wherein the transmitting electrode may simply surround the receiving electrodes. All electrodes may be coupled with a gesture detection controller 940 which detects predefined gestures and touches and generates commands that are fed to a main processing system 930.

Figure 10:
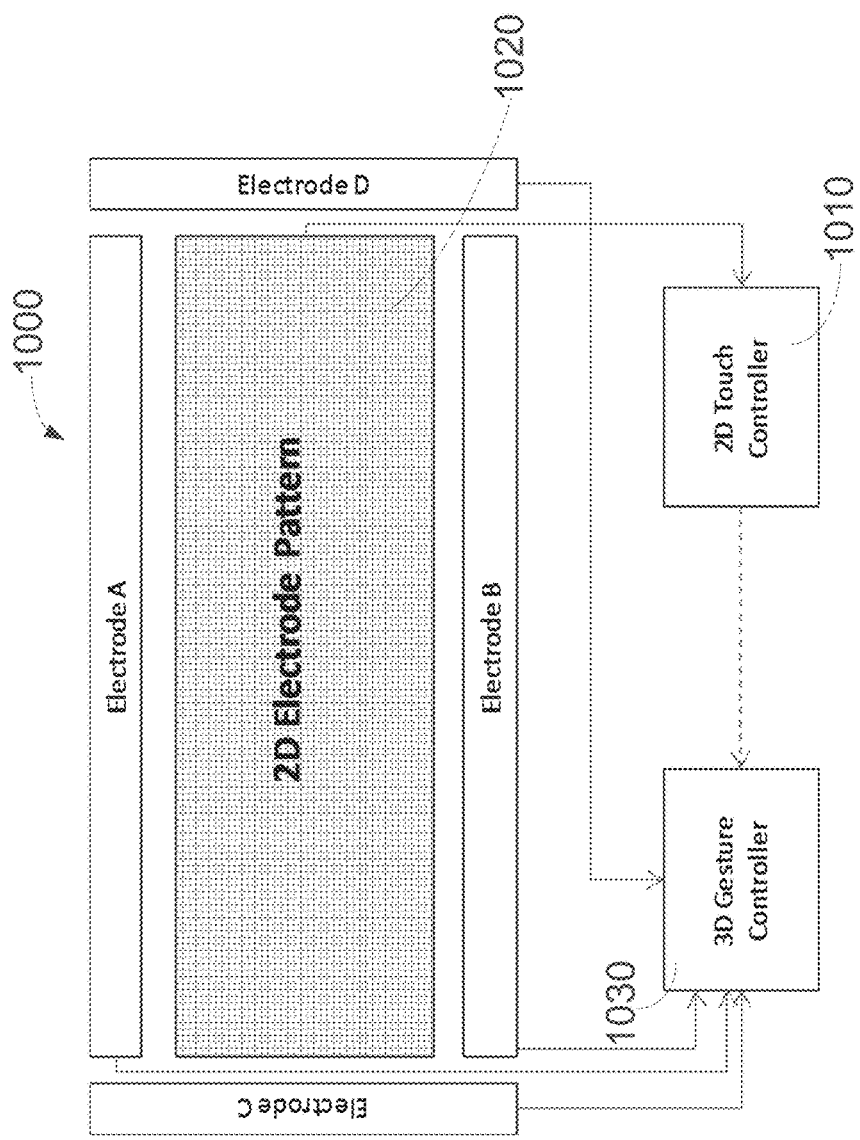
FIG. 10 shows an embodiment of a combined touchless and touch sensor arrangement.

FIG. 10 shows another embodiment of a similar system 1000 combined with a touch pad 1020. Here the electrodes A, B, C, and D surround the touchpad 1020 which may be similar to the embodiment shown in FIG. 1. The touchpad 1020 may be coupled with a touch controller 1010 whereas the electrodes A, B, C, D may be coupled with a 3D-gesture controller 1030. A transmission electrode (not shown) may be arranged below the sensor arrangement 1000 and coupled with the 3D-gesture controller 1030.

The signals received from the various electrodes 910a, b, c, d of FIG. 9 or electrodes A, B, C, D of FIG. 10 may be received and converted in parallel or using a time-multiplexing scheme within the respective controller. However, the same various principles for evaluating sequential samples as discussed above also apply to these non-touching capacitive electrode sensor arrangements.

The invention claimed is:

1. A method for providing projective capacitive sensor detection with one or more capacitive sensors comprising a transmitting electrode and a receiving electrode, the method comprising:

generating a stimulus signal by a signal generator and feeding the stimulus to the transmitting electrode, wherein the stimulus has a stimulus start and a stimulus end, while the stimulus signal is transmitted from the transmitting electrode to the receiving electrode, discharging the receiving electrode for a predetermined time interval before each rising edge of the stimulus and charging the receiving electrode for a predetermined time interval before each failing edge of the stimulus signal thereby generating pairs of modulated samples by a sampling circuit and converting the samples by an analog-to-digital converter;

demodulating the samples and forming data packets, each data packet comprising a plurality of digital samples generated during a sample period having a beginning time corresponding with the stimulus start and an ending time corresponding with the stimulus end;

for each data packet, applying a weighting factor to each of the plurality of digital samples in the respective data packet by providing less gain for digital samples near (a) the beginning time of the sample period and (b) the ending time of the sample period, as compared with digital samples near a center of the respective data packet; and integrating the weighted digital samples to generate a single output value for each data packet.

2. The method according to claim 1, wherein the stimulus signal comprises a sequence of pulses.

3. The method according to claim 2, wherein each pulse alternates between ground and a supply voltage.

4. The method according to claim 1, wherein a gain distribution is symmetrical with respect to the center of each data packet and a gain distribution curve is selected from a group of gain curves consisting of a Gaussian curve, a Hamming window, a Hanning window, and a Blackman window.

5. The method according to claim 1, wherein the charging and discharging is performed by a first switch coupling the receiving electrode with a supply voltage and a second switch coupling the receiving electrode with ground, respectively.

6. The method according to claim 5, wherein a sampling switch within the sampling circuit is controlled to couple the receiving electrode with a sampling capacitor, wherein in a sampling cycle for generating a pair of modulated samples, the method comprises:

coupling the receiving electrode with ground through said second switch for a first time interval while the sampling switch is closed;

during a second time interval, applying a positive stimulus at the transmitting electrode while the first and second switches are open;

opening said sampling switch and acquiring a first digital sample;

while the stimulus is positive and the sampling switch is open, coupling the receiving electrode with the supply voltage through said first switch for a third time interval;

during the third time interval, closing the sampling switch and during a fourth time interval driving the stimulus to ground at the transmitting electrode while the first and second switches are open;

opening said sampling switch and acquiring a second digital sample.

7. The method according to claim 1, wherein the capacitive sensor is a touch sensor.

8. The method according to claim 7, wherein a plurality of touch sensors are arranged in a matrix comprising columns and rows and data packets of samples are sampled in parallel from each column or row.

9. The method according to claim 7, wherein a plurality of touch sensors are arranged in a matrix comprising columns and rows and data packets of samples of different columns/rows are sampled sequentially using multiplexing.

10. The method according to claim 7, wherein a plurality of touch sensors are formed by horizontal and vertical electrodes arranged in a matrix.

11. The method according to claim 7, wherein a plurality of touch sensors are arranged in a matrix and wherein horizontal and vertical electrodes of the matrix are arranged in different layers.

12. The method according to claim 1, wherein four receiving electrodes are associated with the transmitting electrode and form a three-dimensional position detection sensor.

13. The method according to claim 12, wherein the four receiving electrodes are arranged in a frame-like fashion.

14. The method according to claim 13, wherein the four receiving electrodes surround a display or a touchpad sensor.

15. A sensor arrangement with at least one capacitive sensor comprising:

a generator configured to generate a stimulus signal having a stimulus start and a stimulus end;

a transmitting electrode configured to receive the stimulus signal, a receiving electrode capacitively coupled with the transmitting electrode and configured to receive a signal from the transmitting electrode, a charge circuit coupled with the receiving electrode and configured to discharge the receiving electrode for a predetermined time interval before each rising edge of the stimulus and to charge the receiving electrode for a predetermining time interval before each falling edge of the stimulus signal to generate pairs of modulated samples by a sampling circuit;

an analog-to-digital converter coupled with the sampling circuit and configured to convert the pairs of modulated samples to subsequent digital samples; and an post processing circuit coupled with the analog-to-digital converter and configured to demodulate a plurality of subsequent digital samples in a data packet, each data packet comprising a plurality of pairs of modulated digital samples generated during a sample period having a beginning time corresponding with stimulus start and an ending time corresponding with stimulus end, wherein the plurality of digital samples in each data packet are weighted by providing less gain for digital samples near (a) the beginning time of the sample period and (b) the ending time of the sample period, as compared with samples near a center of the respective data packet, and wherein the post-processing circuit is further configured to integrate the weighted digital samples to generate a single output signal for each data packet.

16. The sensor arrangement according to claim 15, wherein the stimulus signal comprises a sequence of pulses.

17. The sensor arrangement according to claim 16, wherein each pulse alternates between ground and a supply voltage.

18. The sensor arrangement according to claim 15, wherein a gain distribution is symmetrical with respect to the center of each data packet and a gain distribution curve is selected from a group of gain curves consisting of a Gaussian curve, a Hamming window, a Hanning window, and a Blackman window.

19. The sensor arrangement according to claim 15, wherein a plurality of touch sensors are arranged in a matrix comprising columns and rows and data packets of samples are sampled in parallel from each column or row.

20. The sensor arrangement according to claim 15, wherein the capacitive sensor is a touch sensor.

21. The sensor arrangement according to claim 20, wherein a plurality of touch sensors are arranged in a matrix comprising columns and rows and data packets of samples of different columns/rows are sampled sequentially using multiplexing.

22. The sensor arrangement according to claim 20, wherein a plurality of touch sensors are formed by horizontal and vertical electrodes arranged in a matrix.

23. The sensor arrangement according to claim 20, comprising a plurality of touch sensors are arranged in a matrix and wherein horizontal and vertical electrodes of the matrix are arranged in different layers.

24. The sensor arrangement according to claim 15, wherein four receiving electrodes are associated with the transmitting electrode and form a three-dimensional position detection sensor.

25. The sensor arrangement according to claim 24, wherein the four receiving electrodes are arranged in a frame-like fashion.

26. The sensor arrangement according to claim 25, wherein the four receiving electrodes surround a display or a touchpad sensor.

27. The sensor arrangement according to claim 15, wherein the charge circuit comprises a first switch coupling the receiving electrode with a supply voltage and a second switch coupling the receiving electrode with ground.

28. The sensor arrangement according to claim 27, wherein the sampling circuit comprises a sampling switch controlled to couple the receiving electrode with a sampling capacitor, wherein in a sampling cycle for generating a pair of modulated samples, the sensor arrangement is configured to:
- couple the receiving electrode with ground through said second switch for a first time interval while the sampling switch is closed;
- drive, during a second time interval, the transmitting electrode to a positive level while the first and second switches are controlled to be open;
- open said sampling switch and to acquire a first digital sample;
- couple, while the stimulus is positive and the sampling switch is open, the receiving electrode with the supply voltage through said first switch for a third time interval;
- close, during the third time interval, the sampling switch and during a fourth time interval drive the stimulus to ground at the transmitting electrode while the first and second switches are controlled to be open;
- open said sampling switch and to acquire a second digital sample.

* * * * *